United States Patent [19]

Park et al.

[11] Patent Number: 5,769,944
[45] Date of Patent: Jun. 23, 1998

[54] VERTICAL GRADIENT FREEZE AND VERTICAL BRIDGMAN COMPOUND SEMICONDUCTOR CRYSTAL GROWTH APPARATUS CAPABLE OF APPLYING AXIAL MAGNETIC FIELD

[75] Inventors: Young Ju Park; Suk-Ki Min, both of Seoul, Rep. of Korea

[73] Assignee: Korea Institute of Science and Technology, Seoul, Rep. of Korea

[21] Appl. No.: 705,000

[22] Filed: Aug. 29, 1996

[30] Foreign Application Priority Data

Dec. 19, 1995 [KR] Rep. of Korea .................. 51993/1995

[51] Int. Cl.$^6$ .................................................. C30B 35/00
[52] U.S. Cl. .......................... 117/223; 117/200; 117/204; 117/205
[58] Field of Search .............................. 117/81, 83, 200, 117/204, 223

[56] References Cited

U.S. PATENT DOCUMENTS

| | | | |
|---|---|---|---|
| 2,402,582 | 6/1946 | Scaff ........................................... | 117/81 |
| 3,022,144 | 2/1962 | Addamiano ................................ | 117/83 |
| 4,904,336 | 2/1990 | Ozawa et al. .............................. | 117/77 |
| 5,135,726 | 8/1992 | Min et al. ................................... | 117/203 |
| 5,186,911 | 2/1993 | Min et al. ................................... | 117/83 |
| 5,438,953 | 8/1995 | Aoki et al. ................................ | 117/223 |
| 5,603,763 | 2/1997 | Taniguchi et al. ......................... | 117/83 |
| 5,611,856 | 3/1997 | Schunemann et al. .................... | 117/83 |

FOREIGN PATENT DOCUMENTS

| | | | |
|---|---|---|---|
| 401126289A | 5/1989 | Japan ........................................ | 117/81 |
| 2090545 | 7/1982 | United Kingdom . | |

OTHER PUBLICATIONS

Kazutaka Terashima et al., "Vertical Field Applied LEC Apparatus for Larger Diameter GaAS Single Crystal Growth," *Japanese Journal of Applied Physics* vol. 23, No. 5, May 5, 1984, pp. L302–L304.

Keigo Hoshikawa, "Czochralski Silicon Crystal Growth in the Vertical Magnetic Field," *Japanese Journal of Applied Physics* Sep. 1982, vol. 21, No. 9, pp. L545–L574.

*Primary Examiner*—Felisa Garrett
*Attorney, Agent, or Firm*—Lower, Price, LeBlanc & Becker

[57] ABSTRACT

An improved vertical gradient freeze and vertical Bridgman compound semiconductor crystal growth apparatus capable of applying an axial magnetic field of about 1600G in the crystal growth axis direction using an electrical resistance type electromagnet which has a simple structure and can be installed easily, which includes a high temperature electric furnace arranged at an upper portion of the apparatus, a crystal growth reaction tube disposed within a low temperature electric furnace arranged below the high temperature electric furnace and having a reaction container disposed therein, and an electromagnet surrounding the intermediate portion of the high temperature electric furnace.

9 Claims, 2 Drawing Sheets

VERTICAL GRADIENT FREEZE AND VERTICAL BRIDGMAN COMPOUND SEMICONDUCTOR CRYSTAL GROWTH APPARATUS CAPABLE OF APPLYING AXIAL MAGNETIC FIELD

BACKGROUND OF THE INVENTION

1. Field of the Invention

The present invention relates to a vertical gradient freeze and vertical Bridgman compound semiconductor crystal growth apparatus capable of applying an axial magnetic field, and particularly to an improved vertical gradient freeze and vertical Bridgman group III–V compound semiconductor crystal growth apparatus capable of applying an axial magnetic field, which are capable of growing a circular, large diameter, and low defect single crystal when growing a GaAs single crystal by applying an axial magnetic field in a vertical gradient freeze method and a vertical Bridgman method.

2. Description of the Conventional Art

In the case of an Si wafer, it is generally prepared by the Czochralski method. This method has a wide application since the yield is very high, while for a GaAs compound semiconductor it has a very low yield with respect to the device.

The above-mentioned problem is based on the inhomogeneous segregation of impurities and various other defects. In particular, the inhomogeneous distribution of the impurities causes a certain variation with respect to the electrical characteristic as well as may be a cause which retards the obtaining of a desired characteristic. In addition, an undesired impurity may act with other impurities or serve as a factor of causing defects within the crystal or reducing the mobility of electron carriers and their lifetimes.

Among the methods for growing a GaAs single crystal which is referred to as a compound semiconductor, the Czochralski method has a difficulty in that the growth may be affected by a convection flow in the molten stage, and it is very difficult to control the occurrence of segregation and defects due to impurities. However, in case of the gradient freeze method and the Bridgman method, these methods are well implemented under the boundary conditions in which the thermal environment can be fixed, and a steady state growth can be experimentally achieved, thus achieving a high quality, and a low defect crystal growth is made through the optimum crystal growth conditions.

In particular, in case of the vertical gradient freeze method or the vertical Bridgman method, the diameter of the crystal is automatically adjusted. If the optimum crystal growth conditions are provided thereto, it is possible to substantially remove any defects. However, even though the heat transfer is accurately controlled during the growth process of a single crystal having a diameter greater than two inches, it is impossible to completely eliminate convective flows in the melt. Therefore, the reason why the crystal growth is performed under a zero gravity or in a magnetic field is because the heat convection of the solution existing during the process of the crystal growth can be minimized, thus improving the crystalline property.

Regarding the single crystal growth technique, from the beginning of the 1980's, a study (in this regard, refer to the article, "K. Hoshikawa, Jpn. J. Appl. Phys. 21, L545 (1982)") had been conducted for growing silicon single crystals by the applied-magnetic field Czochralski method, and in the case of GaAs, a single crystal having a diameter of two inches was first grown by an applied-magnetic field liquid encapsulated Czochralski method (in this regard, refer to the article, K. Terashima J. Cryst. Growth 63, 423 (1983).

However, most of the above-described crystal growth apparatuses are directed to using the magnetic field in the Czochralski method or the applied-magnetic field liquid encapsulated Czochralski method. In addition, since the single crystal growth methods such as the vertical Bridgman method or the Bridgman Stockbarger method use a thick insulation material in the electric furnace, when the diameter is smaller than one inch or is greater than two inches, a superconductive magnet should be used, whereby it is possible to apply a magnetic field of more than 1000 G to the crystal. In addition, the applied-magnetic field technique, which is used for the vertical gradient freeze method, was described in U.S. Pat. Ser. No. 4,904,336. Most of the vertical gradient freeze single crystal growth apparatuses including the above-mentioned apparatus have complicated constructions, and it is difficult to fabricate the same. In addition, since a thick insulation material is used, the magnetic field is not effectively applied to the crystal growth region.

SUMMARY OF THE INVENTION

Accordingly, it is an object of the present invention to provide a vertical gradient freeze and vertical Brigdman compound semiconductor crystal growth apparatus capable of applying an axial magnetic field, which overcome the problems encountered in the conventional semiconductor crystal growth apparatus.

It is another object of the present invention to provide an improved vertical gradient freeze and vertical Bridgman compound semiconductor crystal growth apparatus capable of applying an axial magnetic field, which is capable of applying a magnetic field of about 1600 G in the crystal growth axis direction using an electrical resistance type electromagnet which has a simple structure and which can be easily installed.

It is another object of the present invention to provide an improved vertical gradient freeze and vertical Bridgman compound semiconductor crystal growth apparatus capable of applying an axial magnetic field, which is capable of varying a temperature gradient, which is one of the sensitive factors in the crystal growth conditions, and which is well adaptable to growth of a GaAs single crystal having low defects and a greater diameter, by providing an electromagnet to an electric furnace which is formed of a double stainless steel tube or a double quartz crystal tube in which no insulation materials are used, so as to effectively apply the magnetic field.

To achieve the above objects, there is provided a vertical gradient freeze and vertical Bridgman compound semiconductor crystal growth apparatus, which includes a high temperature electric furnace arranged at an upper portion of the apparatus, a crystal growth reaction tube disposed within a low temperature electric furnace arranged below the high temperature electric furnace and having a reaction container disposed therein, and an electromagnet surrounding an intermediate portion of the high temperature electric furnace.

The high temperature electric furnace includes an inner tube having a gold thin film formed on an inner surface thereof, an outer tube surrounding the inner tube for thus forming therewith, and a double tube consisting of the inner tube and the outer tube and having a cooling water circulation space formed between the inner and outer tubes.

The double tube is made of a stainless steel or a crystal such as quartz. In the case of using the double tube crystal, it is possible to observe the growth process therethrough.

A thin insulation blanket is disposed between the inner surfaces of the high temperature electric furnace and the low temperature electric furnace and a heating coil disposed near the inner surface thereof.

An insulation spacer for preventing contact between the heating coils is inserted between the heating coils, thus preventing deformation of the heating coil by fixing the insulation spacer to a support tube vertically disposed at a frame.

The high temperature electric furnace, the low temperature electric furnace, and the electromagnet are attached to a lifting/lowering unit which is vertically movable along guide rails vertically arranged at the base plate.

The lifting/lowering unit includes pairs of upper and lower sliders guided by the guide rails, an upper support engaged with the upper and lower sliders for supporting the electromagnet, a lower support for supporting the low temperature electric furnace, and a connection bar connected between the upper and lower supports, whereby the high temperature electric furnace, the low temperature electric furnace, and the electromagnet are concurrently or independently lifted and lowered.

The electromagnet is ring-shaped, with the inner diameter thereof being smaller by less than 3 cm than the outer diameter of the high temperature electric furnace.

The height of the electromagnet is two times the length of the crystal to be grown.

Additional advantages, objects and other features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Features of the present invention are described in the article entitled "Application of an axial magnetic field to vertical gradient freeze GaAs single crystal growth," by Y. J. Park et al., Journal of Crystal growth, Vol. 154, Nos. 1/2, pp. 10–18, September 1995, the contents of which are herein incorporated by reference thereto.

Figure 1:
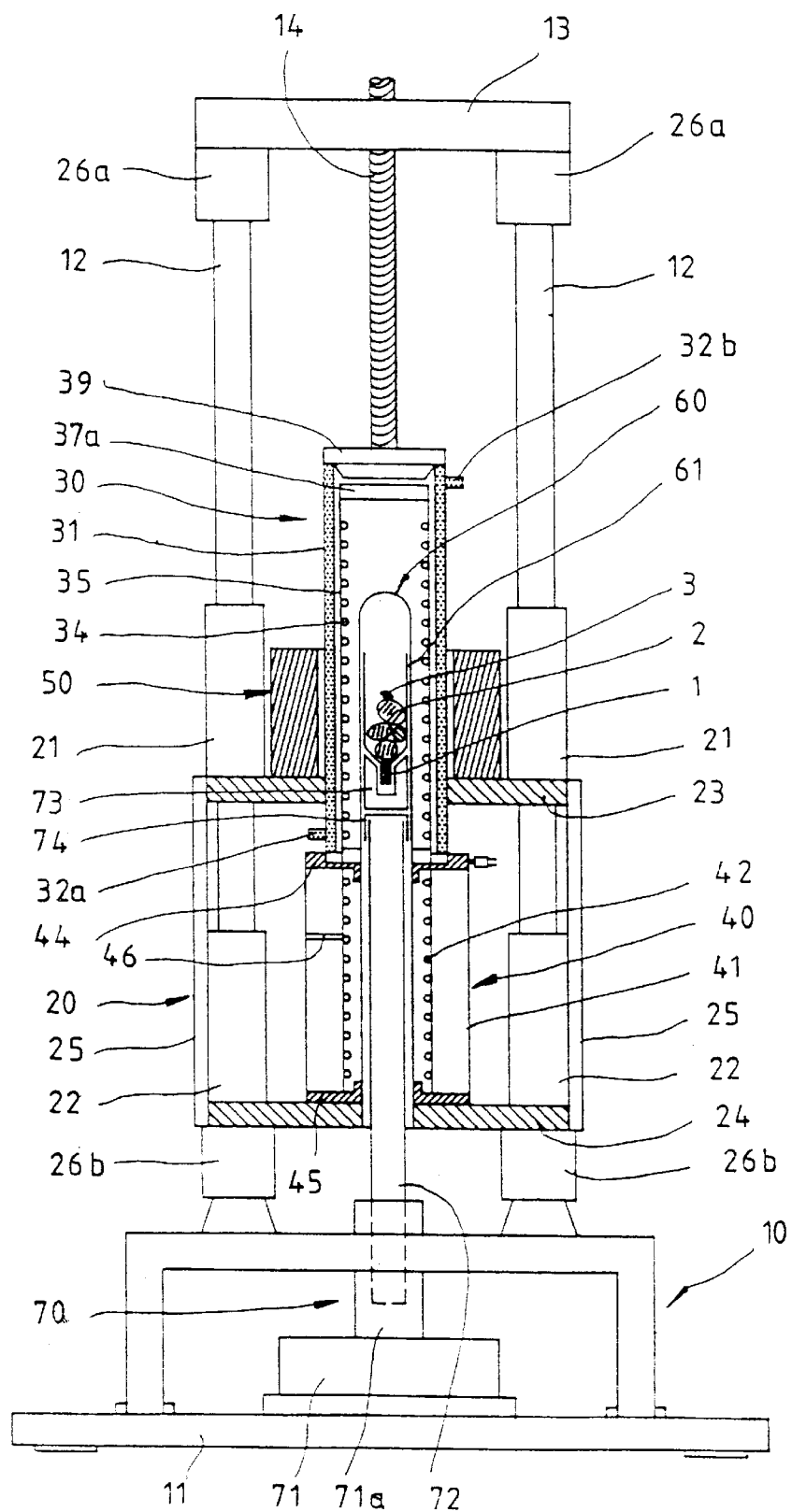
FIG. 1 is a schematic view showing a vertical gradient freeze and vertical Bridgman crystal growth apparatus capable of applying an axial magnetic field according to the present invention.

FIG. 1 shows a vertical gradient freeze and vertical Bridgman crystal growth apparatus which is capable of applying an axial magnetic field according to the present invention.

As shown therein, the vertical gradient freeze and vertical Bridgman crystal growth apparatus includes a frame 10 arranged on the bottom portion of the apparatus for supporting the entire weight of the apparatus. The frame 10 includes a base plate 11 and a pair of guide rails 12 which are vertically arranged at the base plate 11. An upper support 13 is horizontally arranged on the upper portions of the guide rails 12. An electric furnace lifting/lowering driving screw 14 is connected between the upper support 13 and the frame 10. A lifting/lowering unit 20 includes pairs of upper sliders and lower sliders 21 and 22 are guided by the guide rails 12. Upper and lower supports 23 and 24 are engaged to the sliders 21 and 22. A connection bar 25 connects the sliders 23 and 24. A high temperature electric furnace 30 is supported by the lifting/lowering unit 20. A low temperature electric furnace 40 has its upper portion engaged to the lower portion of the high temperature electric furnace 30, and its lower portion is placed on the lower support 24. An electromagnet 50 surrounds the outer circumferential surface of the intermediate portion of the high temperature electric furnace 30 and is mounted on the upper support 23. A crystal reaction tube 60 is arranged inside the high temperature electric furnace 30 and the low temperature electric furnace 40, and a rotation support unit 70 rotatably supports the crystal reaction tube 60.

Upper and lower stoppers 26a and 26b are arranged at the upper and lower portions of the guide rails 12 for restricting the movement of the lifting/lowering unit 20.

The lifting/lowering unit 20 is directed to concurrently or independently lift/lower the high temperature electric furnace 30, the low temperature electric furnace 40, and the electromagnet 50 in accordance with the connection state of the connection bar 25 connecting the upper and lower supports 23 and 24. In addition, a balance weight (not shown) is disposed at the lifting/lowering unit 20 for offsetting the weight applied to the screw 14.

Figure 2:
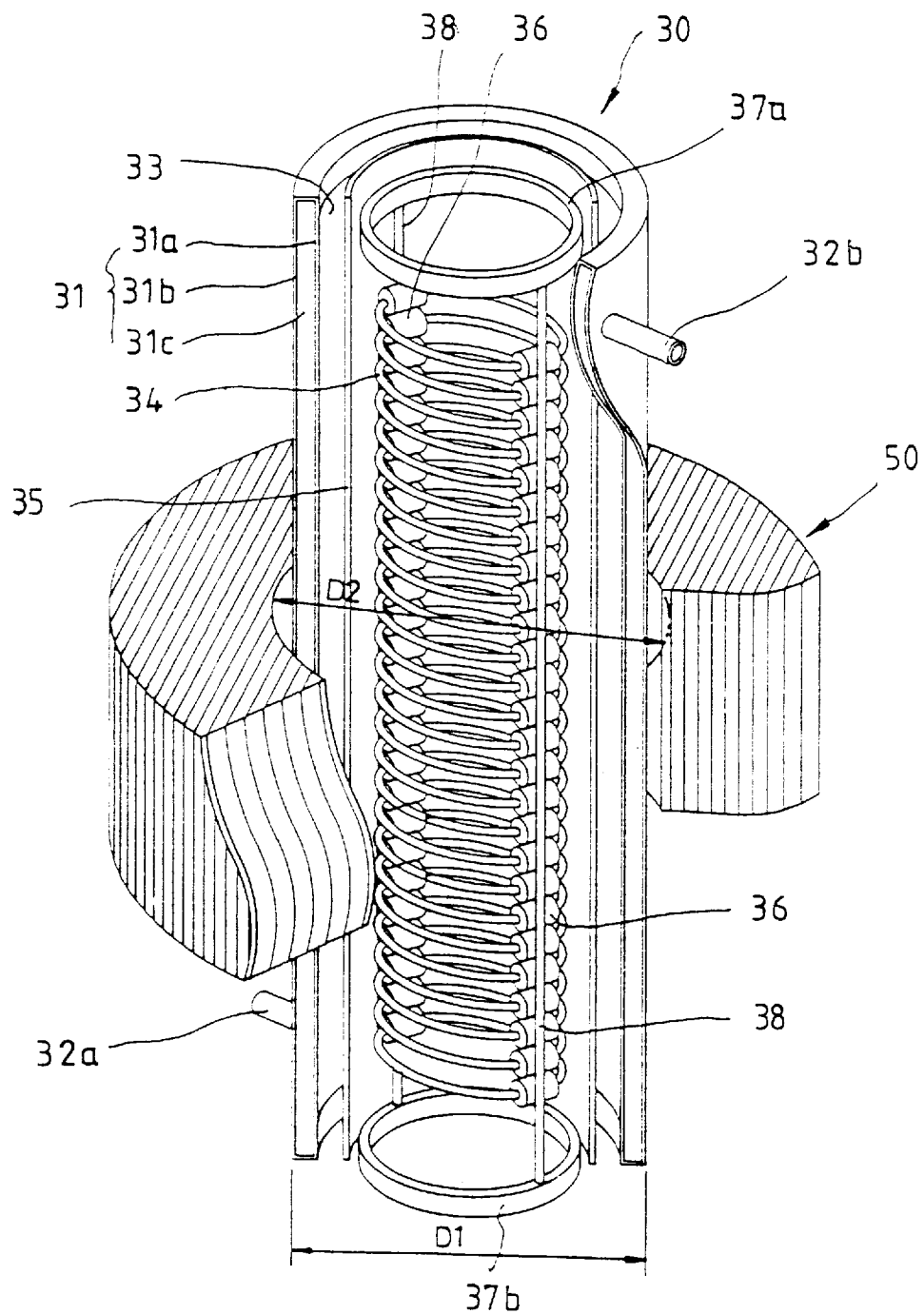
FIG. 2 is a perspective view showing the internal construction of a high temperature electric furnace to which an electromagnet is adapted according to the present invention.

As shown in FIG. 2, the high temperature electric furnace 30 includes a double tube 31 formed of inner and outer tubes 31a and 31b which are made of a stainless steel or a crystalline material between which a cooling water circulation path 31c is formed, with the lower portion of the cooling water circulation path 31c being communicated with a cooling water inlet tube 32a, and with the upper portion of the same being communicated with a cooling water outlet tube 32b.

In addition, a gold thin film 33 is coated on the inner surface of the inner tube 31a of the double tube 31, and a heating coil 34 is disposed inside the inner tube 31a. An insulation tube 35 is disposed between the inner surface of the inner tube 31a and the heating coil 34 so as to prevent the double tube 31 from being heated by the heating coil 34. This insulation tube 35 is made of a relatively thin insulation blanket or a heat resistant crystal tube.

Here, the high temperature electric furnace 30 is formed within the double tube 31, and cooling water is circulated through the cooling water circulation path 31c formed within the double tube 31. Here, the insulation tube 35 may not be used. If the insulation tube 35 is adapted in this embodiment, it is made of a substantially thinner plate.

The heating coil 34 is formed of a super kanthal or a kanthal wire which has two or three temperature regions. In addition, so as to prevent the neighboring turns of the heating coil from coming into contact with each other, a plurality of spacers 36 preferably made of alumina and having a predetermined thickness are inserted between the coil turns, with the spacers 36 forming two spaced-apart columns about the center axis of the high temperature electric furnace 30. In addition, so as to prevent the deformation of the heating coil when heated, upper and lower support rings 37a and 37b are disposed at the upper and lower ends of the heating coil 34. The spacers 36 are bonded to support rods 38 connecting the upper and lower support rings 37a and 37b using a ceramic bond.

A plurality of temperature control units (not shown) are attached at each of two or three different temperature regions, thus achieving a temperature gradient therein, so that a temperature gradient cooling can be obtained.

In addition, a ceramic insulation plate 39 is disposed at the upper portion of the double tube 31 of the high temperature electric furnace 30 in order to prevent heat loss, so that a thermal balance can be achieved inside the double tube 31.

The thickness of the insulation tube 35 is preferably below about 5 mm.

The low temperature electric furnace 40 includes a cylindrical tube 41 of which its upper portion is engaged with the lower portion of the high temperature electric furnace 30 through a ceramic insulation member 44, and its lower portion is placed on the lower support unit 24. A heating coil 42 is disposed inside the inner surface of the cylindrical tube 41, and a ceramic insulation member 43 is inserted between the inner surface of the cylindrical tube 41 and the heating coil 42.

The heating coil 42 is made of Nichrome wire or the like which has three different temperature portions. A ceramic insulation member 45 is disposed between the cylindrical tube 41 and the lower support 24.

In addition, a plurality of temperature control units are attached at each of the three different temperature portions so as to control the temperature at each region whereby the temperature levels are different from each other.

In the drawings, reference numeral 46 denotes a power cable through which electric power is supplied to the heating coils 34 and 42.

The electromagnet 50 is ring-shaped and is inserted onto the double tube 31 of the high temperature electric furnace 30. Here, the intermediate portion of the electromagnet 50 is positioned at a portion at which the crystal growth is formed within the crystal growth reaction tube 60.

The inner diameter $D_2$ of the electromagnet 50 is greater than the outer diameter of the double tube 31 of the high temperature electric furnace 30, and the distance between the outer surface of the double tube 31 and the inner surface of the electromagnet 50 is below about 3 cm so that a magnetic field of about 1600 G can be effectively applied toward the inside of the high temperature electric furnace 30.

In addition, the height of the electromagnet 50 is decided based on the size of the crystal to be grown. Preferably, the height of the electromagnet 50 is about two times the length of the crystal, so that a reliable crystal can be obtained within about 5% of the uniformity of the magnetic field.

The reaction tube 60 may be formed of a closed upper portion and opened lower portion crystal tube and is inserted between the high temperature electric furnace 30 and the low temperature electric furnace 40.

An opened upper portion and closed lower portion reaction container 61 is inserted inside of the reaction tube 60.

The rotation support unit 70 includes a direct current motor 71 disposed at the base plate 11, with the direct current motor 71 having a forward/reverse rotation feature. A rotation rod 72 is engaged with a shaft 71a of the direct current motor 71 and is inserted into the reaction tube 60. A reaction container support unit 73 engaged with the upper portion of the rotation rod 72 supports the reaction container 61.

In the drawings, reference numeral 74 denotes a crystal plug.

The single crystal growth process and effects of the vertical gradient freeze and vertical Bridgman compound semiconductor crystal growth apparatus capable of applying an axial magnetic field according to the present invention will now be explained with reference to the accompanying drawings.

First, a seed crystal 1 is provided in the bottom portion of the reaction container 61 disposed inside the crystal growth reaction tube 60, and a GaAs polycrystal 2 is provided on the seed crystal 1. In addition, As is provided therein for maintaining the pressure in the polycrystal growth reaction tube 60 of the reaction container 61 at one (1) atm.

Thereafter, in a state that a vacuum in the inside of the crystal growth reaction tube 60 is maintained at $10^{-6}$ Torr, the high temperature electric furnace 30 and the low temperature electric furnace 40 are driven by supplying electric power to the heating coils 34 and 42.

As the high temperature electric furnace 30 is driven, the temperature in the poly crystal reaction tube 60 is increased. At this time, the crystal growth reaction tube 60 is rotated in the forward direction or the reverse direction in cooperation with the rotation support unit 70, thus preventing a thermal imbalance therein, and the temperatures of the electric furnaces 30 and 40 are checked using the plurality of temperature detectors attached at the electric furnaces 30 and 40, thus obtaining a predetermined temperature gradient.

Meanwhile, when the interior of the high temperature electric furnace 30 is increased up to about 1200° C., the intensity of the magnetic field is increased from 0 G to 1200 through 1300 G by applying electric power to the electromagnet 50, and thus a crystal is gradually grown. At this time, it is possible to maintain the intensity of the magnetic field at a predetermined level, or increase the intensity of the magnetic field.

At this time, since the high temperature electric furnace 30 comprises the double tube 31 having the inner tube 31a which is coated with the gold thin film 33 and the cooling water circulation path 31c formed between the inner tube 31a and the outer surface 31b, the high temperature electric furnace 30 is effectively cooled by the cooling water provided in the cooling water circulation path 31c, so that it is possible to achieve a thermal condensing force and a uniform temperature distribution at the crystal growth reaction tube 60. Here, a very thin insulation tube may be used between the heating coil 34 and the double tube 31 for insulating the heat from the high temperature electric furnace 30.

In addition, if the double tube 31 of the high temperature electric furnace 30 is made of a crystal tube, it is possible to directly observe the solid-liquid interface shape and the crystal growth for example process through a charge coupled device tube.

In addition, after the crystal growth is finished, and the temperature of the crystal is about 1200° C., the intensity of the magnetic field is lowered down to 0, and then the grown crystal is cooled at room temperature. At this time, it is possible to effectively cool the crystal by using the cooling water provided in the cooling water circulation path 31c.

Since the electric resistance type solenoid electromagnet is disposed at the high temperature electric furnace 30, it is possible to effectively apply the axial magnetic field within the high temperature electric furnace 30, thus achieving a high quality GaAs single crystal growth.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A vertical gradient freeze and vertical Bridgman compound semiconductor crystal growth apparatus, comprising:

a furnace arrangement comprising a high temperature electric furnace arranged at an upper portion of the apparatus and a low temperature electric furnace arranged below the high temperature electric furnace;

a crystal growth reaction tube extending within both the high temperature electric furnace and the low temperature electric furnace of said furnace arrangement and having a reaction container disposed therewithin;

an electromagnet surrounding an intermediate portion of the high temperature electric furnace in a spaced, proximate relationship with an outer circumferential surface thereof; and a lifting/lowering unit for independently lifting and lowering said furnace arrangement and said electromagnet and for allowing the furnace arrangement and said electromagnet to be either lifted and lowered concurrently or lifted and lowered independently of one another.

2. The apparatus of claim 1, wherein said high temperature electric furnace includes:

an inner tube having a gold thin film formed on an inner surface thereof; and an outer tube surrounding the inner tube for thereby forming therewith a double tube consisting of the inner tube and the outer tube and having a cooling water circulation space formed between the inner and outer tubes.

3. The apparatus of claim 2, wherein said double tube is made of stainless steel.

4. The apparatus of claim 2, wherein said double tube is made of a crystalline material.

5. The apparatus of claim 1, wherein a thin insulation blanket is disposed between the inner surfaces of the high temperature electric furnace and the low temperature electric furnace and a heating coil disposed near the inner surface thereof.

6. The apparatus of claim 5, wherein an insulation spacer for preventing a contact between the heating coils is inserted between the heating coils, thus preventing a deformation of the heating coil by fixing the insulation spacer to a support tube vertically disposed at a frame.

7. The apparatus of claim 1, wherein said high temperature electric furnace, said low temperature electric furnace and said electromagnet are attached to the lifting/lowering unit which is vertically movable along guide rails vertically arranged at a base plate.

8. The apparatus of claim 7, wherein said lifting/lowering unit includes:

pairs of upper and lower sliders guided by the guide rails;

an upper support engaged with the upper and lower sliders for supporting the electromagnet;

a lower support for supporting the low temperature electric furnace; and a connection bar connected between the upper and lower supports, whereby the high temperature electric furnace, the low temperature electric furnace, and the electromagnet may be lifted and lowered concurrently in accordance with a vertical Bridgman method and only the electromagnet may be lifted and lowered independently of said furnace arrangement in accordance with a vertical gradient freeze method.

9. The apparatus of claim 1, wherein said electromagnet is ring-shaped, with an inner diameter thereof being larger by less than 3 cm than an outer diameter of the high temperature electric furnace, and wherein the height of said electromagnet is approximately 2 times a length of a crystal to be grown so that a deviation of a distribution of a magnetic field applied to a crystal being grown is within 5%.

* * * * *